US012803147B2

(12) United States Patent
Kwon et al.

(10) Patent No.: US 12,803,147 B2
(45) Date of Patent: Nov. 17, 2026

(54) QUANTUM PROCESSING ARCHITECTURE

(71) Applicant: Samsung Electronics Co., Ltd., Suwon-si (KR)

(72) Inventors: Hyeokshin Kwon, Suwon-si (KR); Jinhyoun Kang, Suwon-si (KR); Insu Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 377 days.

(21) Appl. No.: 18/423,901

(22) Filed: Jan. 26, 2024

(65) Prior Publication Data

US 2024/0260485 A1 Aug. 1, 2024

(30) Foreign Application Priority Data

Jan. 27, 2023 (KR) ........................ 10-2023-0011222
Oct. 12, 2023 (KR) ........................ 10-2023-0136215

(51) Int. Cl.

| | |
|---|---|
| ***H01P 3/12*** | (2006.01) |
| ***G06N 10/40*** | (2022.01) |
| ***H01Q 1/22*** | (2006.01) |
| ***H10N 60/81*** | (2023.01) |
| ***H10N 69/00*** | (2026.01) |
| ***H10W 90/00*** | (2026.01) |

(52) U.S. Cl.
CPC ............. *H01P 3/12* (2013.01); *H01Q 1/2283* (2013.01); *H10N 60/815* (2023.02); *H10N 69/00* (2023.02); *H10W 90/00* (2026.01); *G06N 10/40* (2022.01)

(58) Field of Classification Search
CPC ...... H01P 3/12; H01Q 1/2283; H10N 60/815; H10N 69/00; H10W 90/00; G06N 10/40; G06N 10/00
USPC ...... 333/24 R, 202, 203, 227, 230, 248, 240
See application file for complete search history.

(56) References Cited

U.S. PATENT DOCUMENTS

2012/0319684 A1 12/2012 Gambetta et al.
2016/0292587 A1 10/2016 Rigetti et al.
2018/0069288 A1 3/2018 Minev et al.
2020/0098695 A1 3/2020 Nah et al.
2021/0328127 A1* 10/2021 Kwon .................... G06N 10/40

FOREIGN PATENT DOCUMENTS

KR 10-2018-0122596 A 11/2018
WO WO 2022/201253 A1 9/2022

OTHER PUBLICATIONS

US 10,468,579 B2, 11/2019, Mutus et al. (withdrawn)
Blais et al. "Cavity quantum electrodynamics for superconducting electrical circuits: An architecture for quantum computation" Physical Review 2004 (pp. 1-14).
Holman et al. "3D integration and measurement of a semiconductor double quantum dot with a high-impedance TiN resonator" 2021 (pp. 1-7).

* cited by examiner

*Primary Examiner* — Jorge L Salazar, Jr.
(74) *Attorney, Agent, or Firm* — NSIP Law

(57) ABSTRACT

A quantum processing device includes a first qubit chip including a first qubit device, a second qubit chip including a second qubit device, and a coupler configured to electrically connect the first qubit chip to the second qubit chip by using resonance.

20 Claims, 13 Drawing Sheets

QUANTUM PROCESSING ARCHITECTURE

CROSS-REFERENCE TO RELATED APPLICATIONS

This application is based on and claims priority under 35 U.S.C. § 119 to Korean Patent Application Nos. 10-2023-0011222, filed on Jan. 27, 2023, and 10-2023-0136215, filed on Oct. 12, 2023, in the Korean Intellectual Property Office, the disclosures of which are incorporated by reference herein in their entireties.

BACKGROUND

1. Field

The disclosure relates to a quantum processing architecture including a plurality of qubit devices.

2. Description of Related Art

A quantum computer is a computation device that takes advantage of quantum mechanical phenomena such as quantum superposition and quantum entanglement as its operating principle to perform data processing. A unit element (or information itself) that stores information using a quantum mechanical principle is referred to as a quantum bit or qubit, and may be used as a basic unit of information in a quantum computer.

SUMMARY

Provided is a quantum processing architecture that connects a plurality of qubit chips by using resonance.

Additional aspects will be set forth in part in the description which follows and, in part, will be apparent from the description, or may be learned by practice of the presented embodiments of the disclosure.

According to an aspect of the disclosure, a quantum processing device includes: a first qubit chip including a first qubit device; a second qubit chip including a second qubit device; and a coupler configured to electromagnetically connect the first qubit chip with the second qubit chip by using electromagnetic resonance, wherein the coupler includes a body that defines a first cavity, a first antenna and a second antenna separated from the first antenna within the first cavity, and wherein the first and second antennae are configured to be electromagnetically coupled to each other to enable the first and second qubits to exchange information through the coupling.

The first antenna and the second antenna may include one or more of aluminum (Al), neobium (Nb), indium (In), tantalum (Ta), titanium (Ti), or nitrogen (N).

The first antenna and the second antenna may be integrated with the body.

The first qubit chip may further include a first substrate including a first recess within which the first qubit device is disposed, and the body further includes a first through-hole connecting the first cavity and the first recess.

The first qubit chip further may include a first connection pin within the first through-hole and is configured to electrically connect the first qubit device with the first antenna.

The first connection pin may directly contact the first qubit device.

The first connection pin may be spaced apart from the first antenna and may be configured to be electromagnetically coupled to the first antenna.

The first connection pin may be disposed to protrude from an opening of the first through-hole toward the first cavity.

The quantum processing device may further include an insulating material filling a space between the first connection pin and the first through-hole.

A partial region of the first qubit device may be exposed to the first cavity through the first through-hole.

The first qubit device may be configured to be electromagnetically coupled with the first antenna.

The first antenna and the second antenna may be opposite each other.

The first antenna and the second antenna may be configured such that a longest length of each antenna is ¼ or less of a wavelength of an electromagnetic wave coupling the first antenna and the second antenna.

A longest length of the first cavity may be less than or equal to the wavelength of an electromagnetic wave coupling the first antenna to the second antenna.

The first qubit chip and the second qubit chip may be disposed on a same surface of the first coupler.

The first qubit chip and the second qubit chip may be disposed on different surfaces of the first coupler.

The quantum processing device may further include: a third qubit chip including a third qubit device, wherein the body further includes a second cavity separated from the first cavity, the second cavity configured to electrically connect the second qubit chip with the third qubit chip by using electromagnetic resonance.

The second qubit chip further may include a second substrate including a second recess within which the second qubit device is disposed, and the body further includes a first sub through-hole connecting the first cavity to the second recess and a second sub through-hole connecting the second cavity to the second recess.

The second qubit chip may further include: a first sub connection pin electrically connected with the second qubit device and penetrating the first sub through-hole; and a second sub connection pin electrically connected with the second qubit device and penetrating the second sub through-hole.

The first cavity may include a first sub cavity and a second sub cavity that are separated from each other; the first antenna may include a first sub antenna disposed in the first sub cavity and electrically connected with the first qubit chip, and a second sub antenna disposed in the second sub cavity and electrically connected to the first qubit chip; and the second antenna may include a third sub antenna disposed in the first sub cavity and electrically connected with the second qubit chip, and a fourth sub antenna disposed in the second sub cavity and electrically connected with the second qubit chip.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
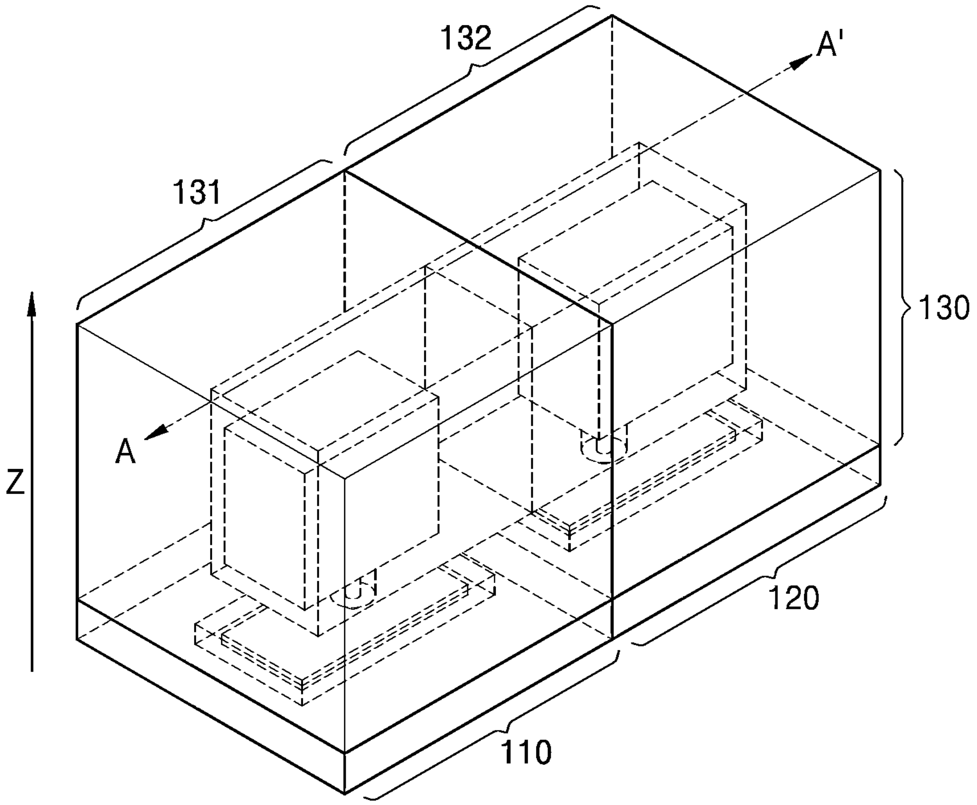
FIG. 1A is a perspective view of a quantum processing architecture according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

All examples or exemplary terms are just used herein to describe technical ideas and should not be considered for purposes of limitation unless defined by the claims.

Hereinafter, embodiments of the disclosure will be described in detail merely as examples with reference to the accompanying drawings.

Figure 1B:
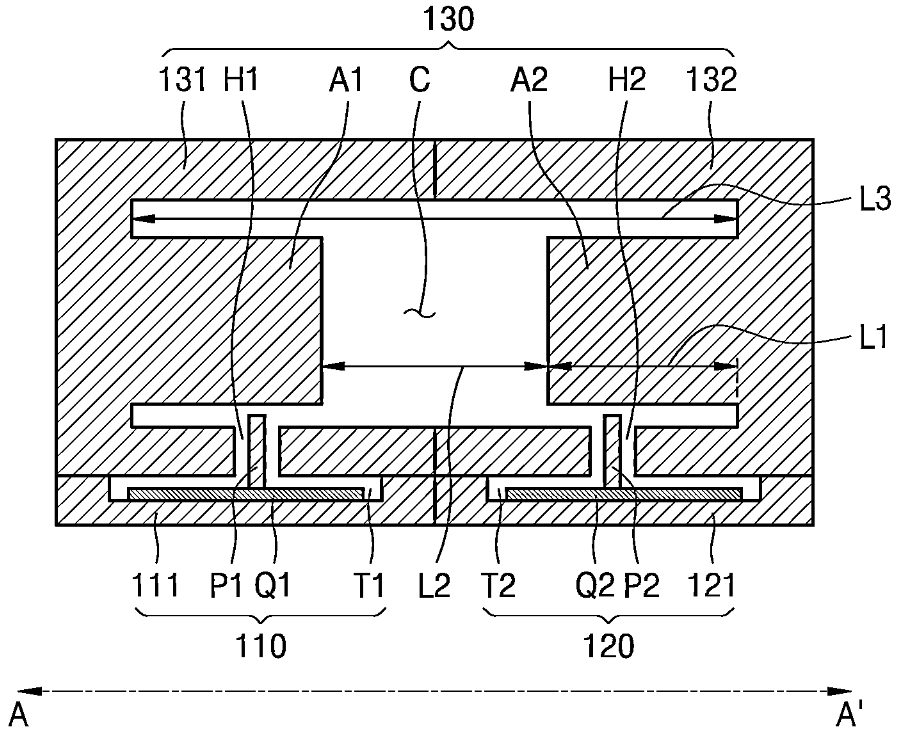
FIG. 1B is a cross-sectional view of the quantum processing architecture of FIG. 1A.

FIG. 1A is a perspective view of a quantum processing architecture according to one or more embodiments. FIG. 1B is a cross-sectional view of the quantum processing architecture of FIG. 1A. The quantum processing architecture may include multiple qubit chips 110 and 120 and a coupler 130 that electrically connects the qubit chips 110 and 120 using resonance. The qubit chips 110 and 120 may be disposed on a surface of the coupler 130, for example, a lower surface of the coupler 130 (i.e., the upper surfaces of the qubit chips 110 and 120 may abut the lower surface of the coupler 130).

Referring to FIGS. 1A and 1B, the quantum processing architecture may include a first qubit chip 110 including a first qubit device Q1, a second qubit chip 120 including a second qubit device Q2, and the coupler 130 providing resonance to electrically connect the first qubit chip 110 with the second qubit chip 120.

The first qubit device Q1 may have nonlinear coupling. For example, the first qubit device Q1 may be a Josephson junction, which may include a first superconducting material pattern, a second superconducting material pattern, facing each other, and a non-superconducting material pattern (e.g., a dielectric layer) or an air gap between the first and second superconducting material patterns. Cooper pairs may tunnel the Josephson junction. Cooper pairs are electron pairs not subjected to electrical resistance inside a superconducting material pattern. Cooper pairs indicate the same quantum information and are expressed in the same wave function. The first qubit device Q1 may include one or more qubits and a connection wiring connected to the one or more qubits.

The first qubit chip 110 may further include a first substrate 111 including a first trench T1 (or recess). The first qubit device Q1 may be disposed in the first trench T1. The first substrate 111 may include a superconducting material. For example, the first substrate 111 may include aluminum (Al), neobium (Nb), indium (In), tantalum (Ta), titanium (Ti), and nitrogen (N), or a combination thereof; any superconducting material may be used. The first substrate 111 partly surrounds the first qubit device Q1, thereby blocking noise from the outside. Accordingly, the first substrate 111 may function as a shielding layer.

Like the first qubit device Q1, the second qubit device Q2 may also include a Josephson junction. The second qubit device Q2 may include one or more qubits and a connection wiring. Either of the first qubit device Q1 or the second qubit device Q2 may serve as a readout unit, and the other may serve as a storage unit. Alternatively, both the first qubit device Q1 and the second qubit device Q2 may function as storage units.

Like the first qubit chip 110, the second qubit chip 120 may also include a second substrate 121 partly surrounding the second qubit device Q2. A second trench T2 may be formed in the second substrate 121, and the second qubit device Q2 may be disposed in the second trench T2.

The second substrate 121 may include a superconducting material. For example, the second substrate 121 may include aluminum (Al), neobium (Nb), indium (In), tantalum (Ta), titanium (Ti), and nitrogen (N), or a combination thereof; any superconducting material may be used. The second substrate 121 partly surrounds the second qubit device Q2, thereby blocking noise from the outside. Accordingly, the second substrate 121 may function as a shielding layer.

The coupler 130 may electrically connect the first qubit chip 110 with the second qubit chip 120. The coupler 130 may include first and second bodies 131 and 132 surrounding a cavity C. The first and second bodies 131 and 132 may each include a superconducting material. For example, the first and second bodies 131 and 132 may each include aluminum (Al), neobium (Nb), indium (In), tantalum (Ta), titanium (Ti), and nitrogen (N), or a combination thereof. The first and second bodies 131 and 132 may each function as a shielding layer blocking noise from the outside.

The coupler 130 may include a first antenna A1 and a second antenna A2 spaced apart from each other within the cavity C. The first antenna A1 and the second antenna A2 may be respectively formed integrally with the first and second bodies 131 and 132. For example, the first antenna A1 may be formed integrally with a first body 131, and the second antenna A2 may be formed integrally with a second body 132, but the disclosure is not limited thereto. The first antenna A1 and the second antenna A2 may be manufactured separately and respectively combined with the first and second bodies 131 and 132. The antenna A1 may be formed by the overall interior shape of the first body 131, and the antenna A2 may be formed by the overall interior shape of the second body 132.

The first antenna A1 and the second antenna A2 may be electromagnetically coupled to each other. The first antenna A1 and the second antenna A2 may be disposed symmetrically with respect to a central horizontal axis of the coupler 130. The longest length L1 of each of the second antenna A2 of the first antenna A1 may be ¼ or less of a wavelength of an electromagnetic wave coupled to each of the first antenna A1 and the second antenna A2. A spacing L2 between the first antenna A1 and the second antenna A2 may be ¼ or less of the wavelength of the coupled electromagnetic wave. The longest length L3 of a space in the cavity C excluding the first antenna A1 and the second antenna A2 may be less than or equal to the wavelength of the electromagnetic wave.

The first antenna A1 and the second antenna A2 may each also include a superconducting material. For example, the first antenna A1 and the second antenna A2 may each include aluminum (Al), neobium (Nb), indium (In), tantalum (Ta), titanium (Ti), nitrogen (N), a combination thereof, or any other suitable superconducting material. The first antenna A1 and the second antenna A2 may have thicknesses, in the direction (Z direction, see FIG. 1A), in the respective first and second bodies 131 and 132 to respectively overlap the first qubit chip 110 and the second qubit chip 120 in the Z direction. A first through-hole H1 may overlap the first antenna A1, and a second through-hole H2 may overlap the second antenna A2 in the thickness direction (Z direction) of the bodies 131 and 132. The first antenna A1 may be spaced apart from and electromagnetically coupled to a first connection pin P1, and the second antenna A2 may be spaced apart from and electromagnetically coupled to a second connection pin P2. A spacing between the first antenna A1 and the first connection pin P1 and a spacing between the second antenna A2 and the second connection pin P2 may each be ⅛ or less of the wavelength of the electromagnetic wave.

The first and second through-holes H1 and H2 are respectively formed in lower regions of the first and second bodies 131 and 132. For example, the first through-hole H1 is formed in the lower region of the first body 131, and the second through-hole H2 is formed in the lower region of the second body 132. One opening of the first through-hole H1 may open to the first trench T1, and the other opening of the first through-hole H1 may open to the cavity C. Similarly, one opening of the second through-hole H2 may open to the second trench T2, and the other opening of the second through-hole H2 may open to the cavity C.

The first qubit chip 110 may further include the first connection pin P1 passing through the first through-hole H1 and electrically connected to the first qubit device Q1. The first connection pin P1 may protrude from the first through-hole H1. For example, the first connection pin P1 may be disposed to protrude by about several mm or more above an upper surface of the first substrate 111 (having the through-hole H1). The first connection pin P1 may include a superconducting material such as aluminum (Al), neobium (Nb), indium (In), tantalum (Ta), titanium (Ti), nitrogen (N), and/or the like. The first connection pin P1 may have a diameter of about between 0.5 mm and 3 mm.

The first connection pin P1 may directly contact the first qubit device Q1; an additional connection wiring may be further disposed between the first connection pin P1 and the first qubit device Q1. For example, one end of the connection wiring may be in contact with the first qubit device Q1 and the other end thereof may be in contact with the first connection pin P1.

The second qubit chip 120 may further include the second connection pin P2 passing through the second through-hole H2 and electrically connected to the second qubit device Q2. The second connection pin P2 may protrude above the second through-hole H2. For example, the second connection pin P2 may be disposed to protrude above surface of the second substrate 121 (having the through-hole H2) by about several mm or more. The second connection pin P2 may directly contact the second qubit device Q2; an additional connection wiring may be further disposed between the second connection pin P2 and the second qubit device Q2.

The first antenna A1 may be electromagnetically coupled to the first connection pin P1 and electromagnetically coupled to the second antenna A2. The second antenna A2 may be electromagnetically coupled to the second connection pin P2. Thus, quantum information between qubit devices may be transmitted through this chain of coupled resonance in an electromagnetic wave mode.

The first antenna A1 and the first connection pin P1 are spaced apart from each other. Similarly, the second antenna A2 and the second connection pin P2 are spaced apart from each other, but the disclosure is not limited thereto. The first antenna A1 may directly contact the first connection pin P1 and/or the second antenna A2 may directly contact the second connection pin P2.

Although it is possible to use a waveguide chip to connect the qubit chips, a waveguide chip may suffer severe information loss during a data transfer process. For example, information loss may occur in a process of converting an electrical signal into an optical signal, and quantum information may deteriorate. Quantum processing architectures described herein may form a coupling resonator having a cavity by using a superconducting material, thereby reducing the loss of quantum information and increasing reliability.

Figure 2A:
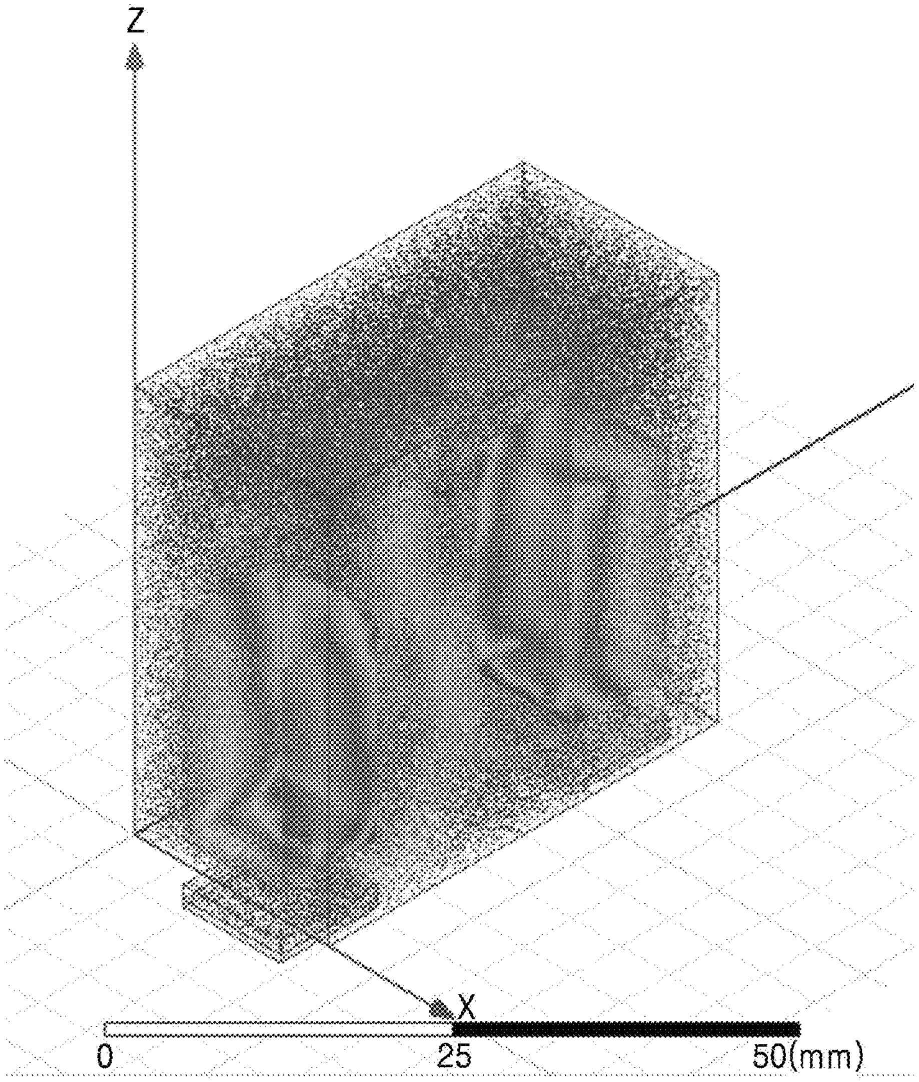
FIGS. 2A and 2B show results of simulating a quantum processing architecture according to one or more embodiments.
Figure 2B:
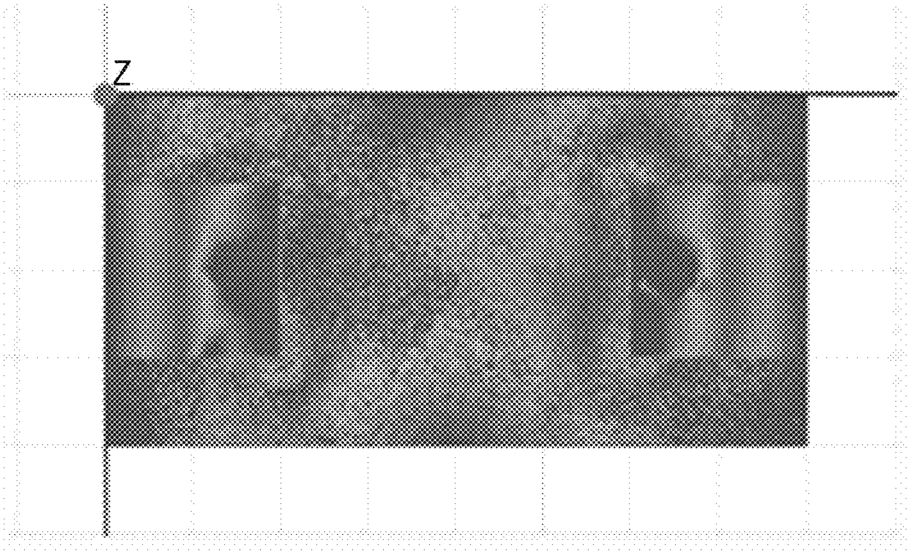

FIGS. 2A and 2B show results of simulating a quantum processing architecture according to one or more embodiments. The cavity C is formed such that a resonance frequency becomes 5.029 GHz, for example, and quantum information is transmitted from the first qubit device Q1 to the second qubit device Q2 via the antenna/electromagnetic coupling. As shown in FIGS. 2A and 2B, it has been confirmed that electromagnetic coupling is performed well within the cavity C.

Figure 3:
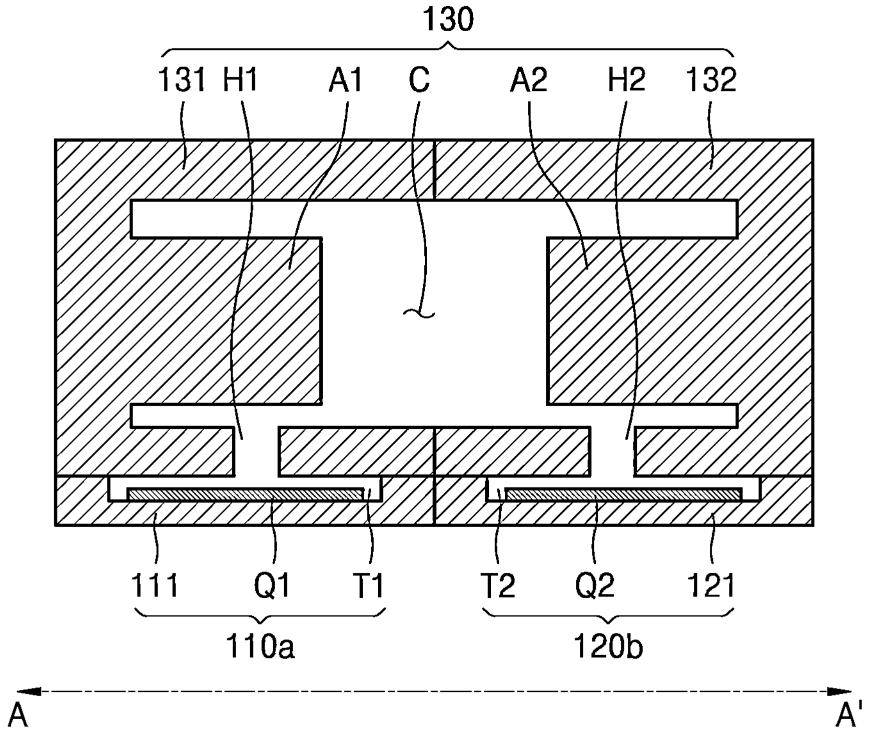
FIG. 3 illustrates a quantum processing architecture in which antennas and qubit devices are coupled to each other, according to one or more embodiments.

FIG. 3 illustrates a quantum processing architecture in which the first and second antennae A1 and A2 are respectively coupled to the first and second qubit devices Q1 and Q2 according to one or more embodiments. In comparison with FIG. 1B and FIG. 3, a first qubit chip 110*a* and a second qubit chip 120*a* (FIG. 3) do not respectively include the first connection pin P1 and the second connection pin P2. The first qubit device Q1 may be directly electromagnetically coupled to the first antenna A1, and the second qubit device Q2 may be directly electromagnetically coupled to the second antenna A2 (directly coupled with electromagnetic energy). A spacing between the first qubit device Q1 and the first antenna A1 may be ¼ or less of a wavelength coupled to an electromagnetic wave such that the first qubit device Q1 and the first antenna A1 are coupled to each other, and a spacing between the second qubit device Q2 and the second antenna A2 may be ¼ or less of an operation wavelength such that the second qubit device Q2 and the second antenna A2 are coupled to each other.

Figure 4:
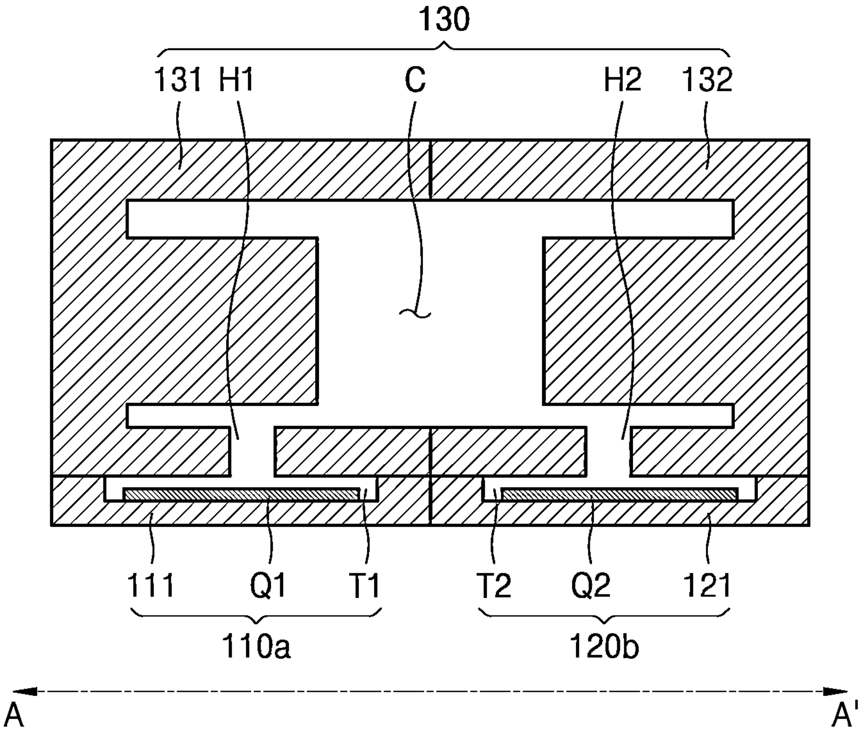
FIG. 4 illustrates a quantum processing architecture in which qubit devices are connected to each other through a cavity, according to one or more embodiments.

FIG. 4 illustrates a quantum processing architecture in which the first and second qubit devices Q1 and Q2 are connected to each other through the cavity C according to one or more embodiments. In comparison with FIGS. 3 and 4, a coupler 130*a* may not include the first antenna A1 and the second antenna A2 which are included in the coupler 130 of FIG. 3. A partial region of the first qubit device Q1 may be exposed to the cavity C through the first through-hole H1, and a partial region of the second qubit device Q2 may be exposed to the cavity C through the second through-hole H2. The first qubit device Q1 may be directly electromagnetically coupled to the second qubit device Q2 through the cavity C. The first trench T1, the first through-hole H1, the cavity C, the second through-hole H2, and the second trench T2 may form the three-dimensional (3D) cavity C to transmit quantum information between the first and second qubit devices Q1 and Q2 in an electromagnetic mode. The volume of the 3D cavity C may be enough for electromagnetic waves of between about 1 GHz and 10 GHz to resonate.

Figure 5:
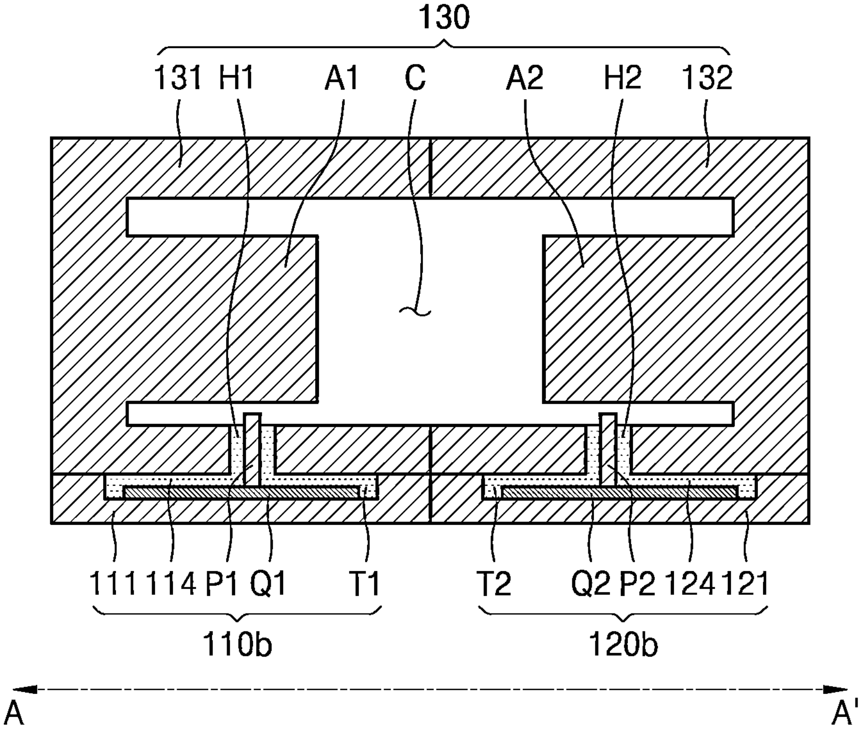
FIG. 5 illustrates a quantum processing architecture including insulating materials respectively surrounding connection pins, according to one or more embodiments.

FIG. 5 illustrates a quantum processing architecture including first and second insulating materials 114 and 124 respectively surrounding the first and second connection pins P1 and P2 according to one or more embodiments. In comparison with FIG. 1B and FIG. 5, the quantum processing architecture of FIG. 5 may further include the first and second insulating materials 114 and 124 respectively surrounding the first and second connection pins P1 and P2. The first insulating material 114 may fill the first trench T1 and the first through-hole H1, and the second insulating material 124 may fill the second trench T2 and the second through-hole H2. The first and second insulating materials 114 and 124 may prevent quantum information from leaking from the first and second connection pins P1 and P2 and from the qubit devices.

As shown in the drawing, the first and second insulating materials 114 and 124 may respectively fill the first and second trenches T1 and T2 and the first and second through-holes H1 and H2, but the disclosure is not limited thereto. The first and second insulating materials 114 and 124 may respectively only fill the first and second trenches T1 and T2.

It has been described above that the qubit chips 110, 110*a*, 110*b*, 120, 120*a*, and 120*b* are disposed in a direction perpendicular to the thickness direction (Z-axis direction) of the couplers 130 and 130*a*. However, the disclosure is not limited to this configuration. The qubit chips 110, 110*a*, 110*b*, 120, 120*a*, and 120*b* may be disposed parallel to the thickness direction (Z-axis direction) of the couplers 130 and 130*a*.

Figure 6A:
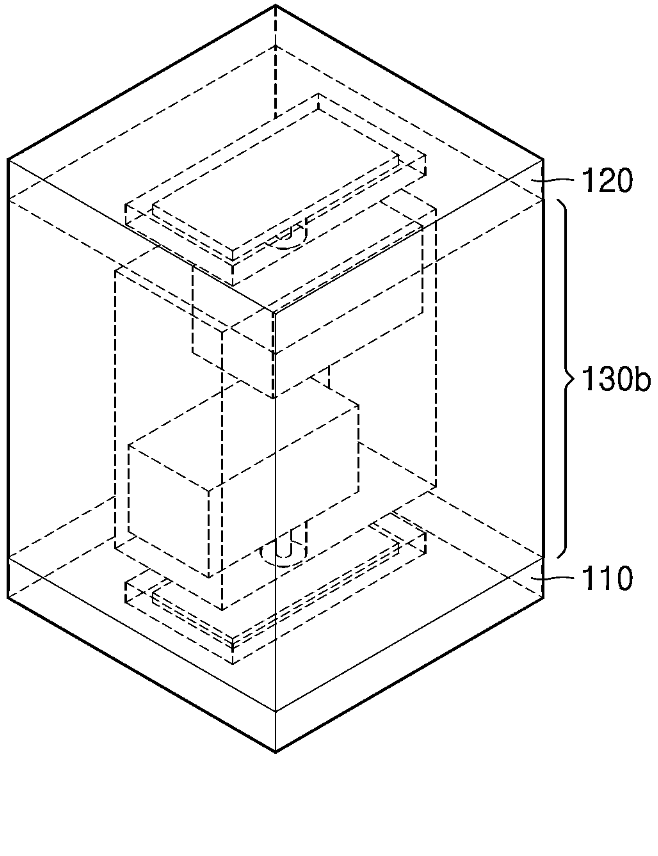
FIGS. 6A and 6B illustrate a quantum processing architecture including qubit chips disposed parallel to a thickness direction of a coupler, according to one or more embodiments.
Figure 6B:
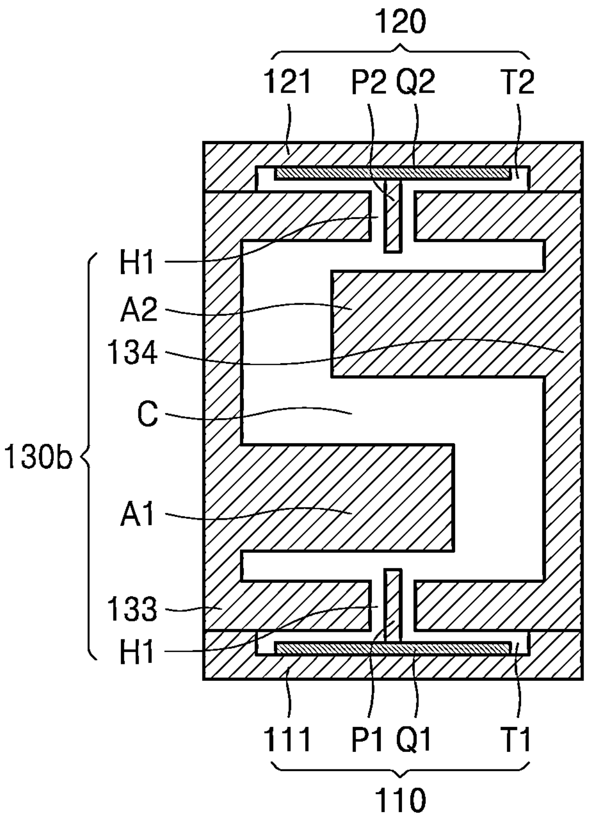

FIGS. 6A and 6B illustrate a quantum processing architecture including the first and second qubit chips 110 and 120 disposed parallel to the thickness direction of a coupler 130*b* according to one or more embodiments.

Referring to FIGS. 6A and 6B, the first qubit chip 110 and the second qubit chip 120 may contact different surfaces of the coupler 130*b*. For example, the first qubit chip 110 may be disposed on a lower surface of the coupler 130*b*, and the second qubit chip 120 may be disposed on an upper surface of the coupler 130*b*.

The coupler 130*b* may include a first body 133 and a second body 134. The first body 133 and the second body 134 may be combined to define the cavity C, the first through-hole H1, and the second through-hole H2. The first antenna A1 may be disposed in the first body 133, and the second antenna A2 may be disposed in the second body 134. The first antenna A1 and the second antenna A2 may be respectively formed integrally with the first body 133 and the second body 134.

The longest length of each of the first antenna A1 and the second antenna A2 may be ¼ or less of a wavelength of an electromagnetic wave coupled to each of the first antenna A1 and the second antenna A2. A spacing between the first antenna A1 and the second antenna A2 may be ¼ or less of the wavelength of the coupled electromagnetic wave. The longest length of a space in the cavity C excluding the first antenna A1 and the second antenna A2 may be the wavelength of the coupled electromagnetic wave.

Figure 7A:
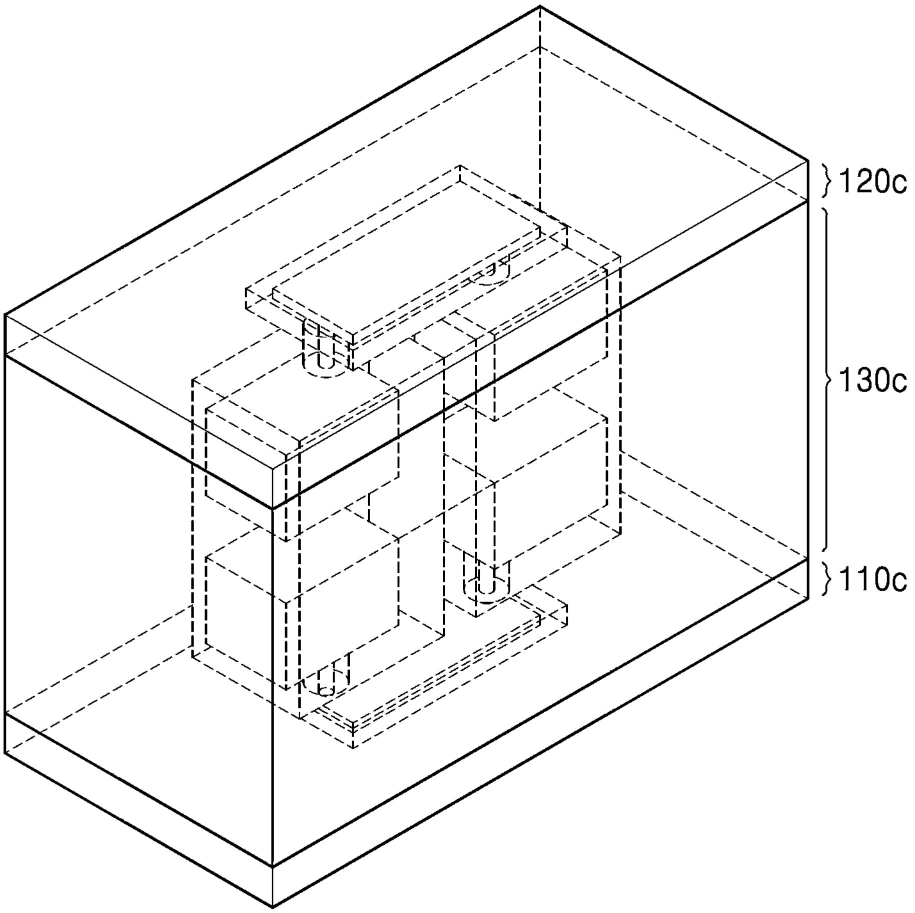
FIGS. 7A and 7B illustrate a quantum processing architecture including cavities, according to one or more embodiments.
Figure 7B:
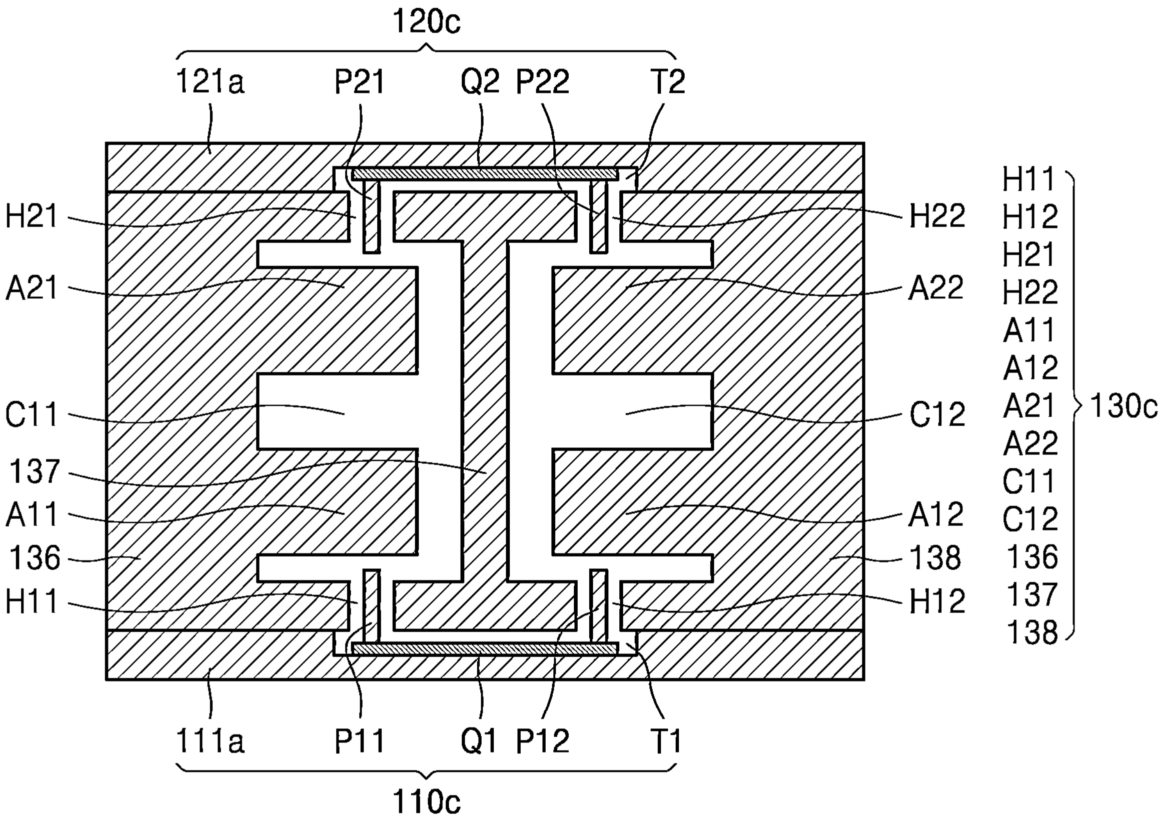

FIGS. 7A and 7B illustrate a quantum processing architecture including cavities C11 and C12 according to one or more embodiments.

Referring to FIGS. 7A and 7B, a first qubit chip 110*c* and a second qubit chip 120*c* may contact different surfaces of a coupler 130*c*. For example, the first qubit chip 110*c* may be disposed on a lower surface of the coupler 130*c*, and the second qubit chip 120*c* may be disposed on an upper surface of the coupler 130*c*.

The coupler 130*c* may include a first sub cavity C11 and a second sub cavity C12 that are separated from each other. The first sub cavity C11 is the space in FIG. 7B with a backwards "E" profile, and the second sub cavity C11 is the space with a forwards "E" profile. The coupler 130*c* may include a first body 136, a second body 137, and a third body 138. The first body 136 and the second body 137 may be combined to define the first sub cavity C11, a first sub through-hole H11, and a third sub through-hole H21. The second body 137 and the third body 138 may be combined to define the second sub cavity C12, a second sub through-hole H12, and a fourth sub through-hole H22. The first sub cavity C11 may be connected to the first sub through-hole H11 and the third sub through-hole H21, and the second sub cavity C12 may be connected to the second sub through-hole H12 and the fourth sub through-hole H22.

A first sub antenna A11 and a third sub antenna A21 that are separated from each other and electromagnetically coupled to each other may be disposed in the first sub cavity C11, and a second sub antenna A12 and a fourth sub antenna A22 that are spaced apart from each other and electromagnetically coupled to each other may be disposed in the second sub cavity C12.

The first sub antenna A11 and the third sub antenna A21 may be formed integrally with the first body 136, and the second sub antenna A12 and the fourth sub antenna A22 may be formed integrally with the third body 138. However, the disclosure is not limited thereto. The first sub antenna A11, the second sub antenna A12, the third sub antenna A21, and the fourth sub antenna A22 may be formed integrally with the second body 137. Alternatively, either of the first sub antenna A11 or the third sub antenna A21 may be formed in the first body 136, and the other one may be formed in the second body 137. Likewise, either of the second sub antenna A12 and the fourth sub antenna A22 may be formed in the second body 137, and the other may be formed in the third body 138.

The first qubit chip 110*c* may include a first substrate 111*a* having the first qubit device Q1 and the first trench T1. The first qubit device Q1 may be disposed in the first trench T1. One end of each of the first sub through-hole H11 and the second sub through-hole H12 may be connected to the first trench T1. The first qubit device Q1 may be disposed in the first trench T1.

The first qubit chip 110*c* may further include a first sub connection pin P11 whose ends extend from the openings of the first sub through-hole H11 and is electrically connected to the first qubit device Q1, and a second sub connection pin P12 whose ends extend from the openings of the second sub through-hole H12 and is electrically connected to the first qubit device Q1.

The second qubit chip 120*c* may include a second substrate 121 having the second qubit device Q2 and the second trench T2. The second qubit device Q2 may be disposed in the second trench T2. One end of each of the third sub through-hole H21 and the fourth sub through-hole H22 may be connected to the second trench T2.

The second qubit chip 120*c* may further include a third sub connection pin P21 whose ends extend beyond the openings of the third sub through-hole H21 and is electrically connected to the second qubit device Q2 and a fourth sub connection pin P22 whose ends extend beyond the openings of the fourth sub through-hole H22 and is electrically connected to the second qubit device Q2.

The first sub antenna A11 may be electrically connected to the first sub connection pin P11, the second sub antenna A12 may be electrically connected to the second sub connection pin P12, the third sub antenna A21 may be electrically connected to the third sub connection pin P21, and the fourth sub antenna A22 may be electrically connected to the fourth sub connection pin P22.

The first qubit device Q1 and the second qubit device Q2 may transmit quantum information via electromagnetic coupling through the first sub cavity C11 and the second sub cavity C12. The quantum information is transmitted through multiple sub cavities, and thus, the reliability of information transmission may be further increased.

Figure 8A:
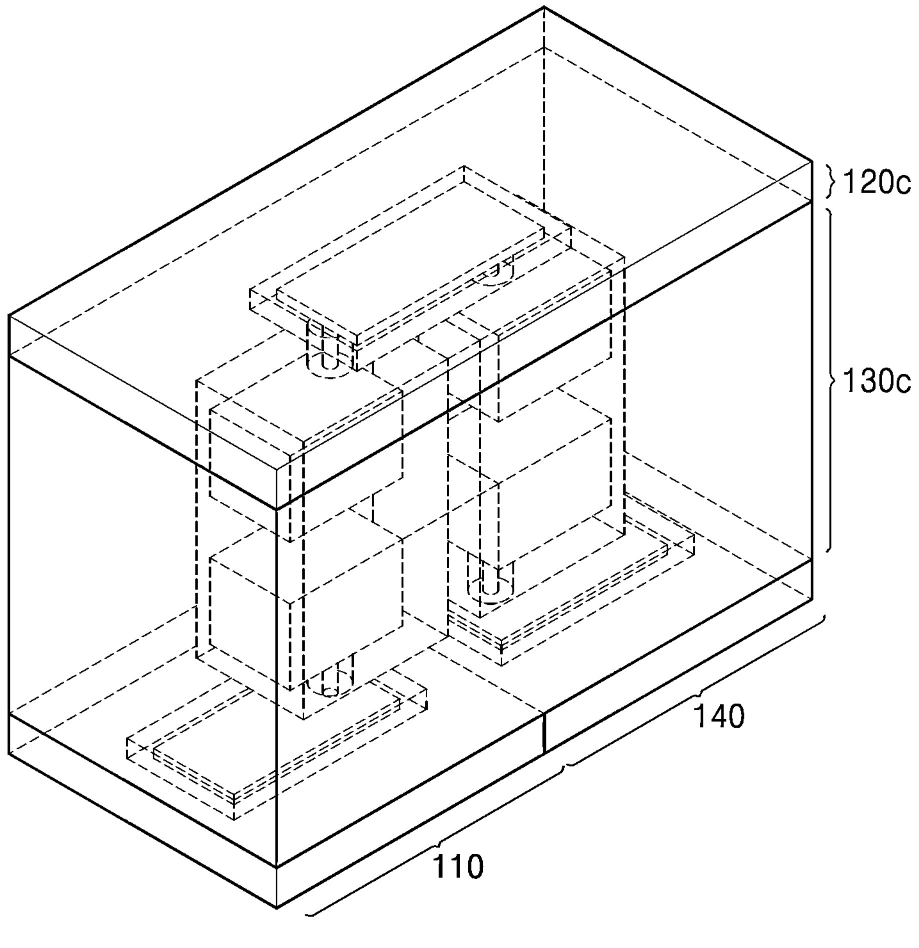
FIGS. 8A and 8B illustrate a quantum processing architecture in which one qubit chip is electromagnetically coupled to multiple qubit chips, according to one or more embodiments.
Figure 8B:
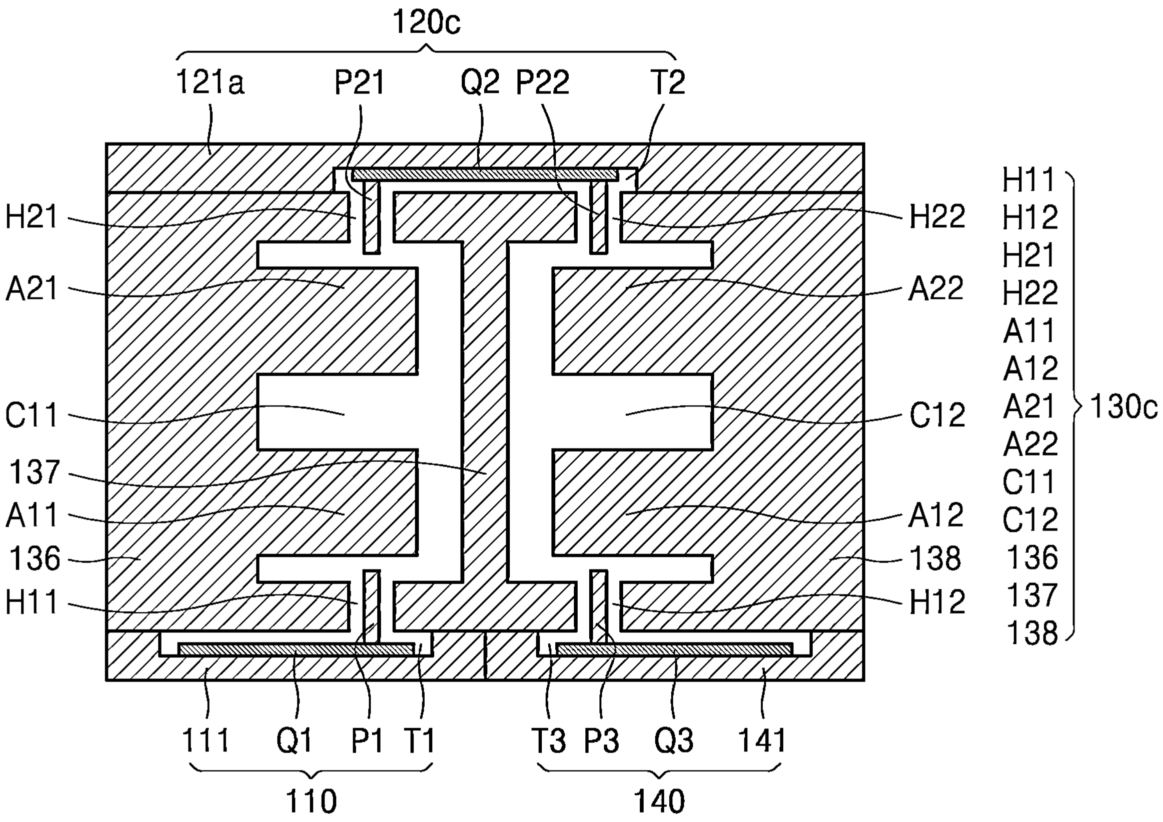

FIGS. 8A and 8B illustrate a quantum processing architecture in which one qubit chip is electromagnetically coupled to multiple qubit chips according to one or more embodiments.

As shown in FIGS. 8A and 8B, the quantum processing architecture may include first to third qubit chips 110, 120*c*, and 140, and the coupler 130*c*. The first and third qubit chips 110 and 140 may be disposed on a lower surface of the coupler 130*c*, and the second qubit chip 120*c* may be disposed on an upper surface of the coupler 130*c*. A structure of the coupler 130*c* shown in FIGS. 8A and 8B is the same as the structure of the coupler 130*c* shown in FIGS. 7A and 7B, and thus, a detailed description thereof is omitted.

The first qubit chip 110 may include the first substrate 111 having the first qubit device Q1 and the first trench T1. The first qubit device Q1 may be disposed in the first trench T1.

One end of the first sub through-hole H11 included in the coupler 130*c* may be connected to the first trench T1. The first qubit chip 310 may further include the first sub connection pin P11 whose ends extend past the openings of the first sub through-hole H11 and is electrically connected to the first qubit device Q1.

The second qubit chip 120*c* may include the second substrate 121*a* having the second qubit device Q1 and the second trench T2. The second qubit device Q2 may be disposed in the second trench T2.

One end of each of the third sub through-hole H21 and the fourth sub through-hole H22 included in the coupler 130*c* may be connected to the second trench T2. The second qubit chip 120*c* may further include a third sub connection pin P21 whose ends extend past the openings of the third sub through-hole H21 and is electrically connected to the second qubit device Q2 and a fourth sub connection pin P22 whose ends extend past the openings of the fourth sub through-hole H22 and is electrically connected to the second qubit device Q2.

The third qubit chip 140 may include a third substrate 141 having a third qubit device Q3 and a third trench T3. The third qubit device Q3 may be disposed in the third trench T3.

One end of the second sub through-hole H12 included in the coupler 130*c* may be connected to the third trench T3. The third qubit chip 140 may further include the second sub connection pin P12 whose ends extend past the openings of the second sub through-hole H12 and is electrically connected to the third qubit device Q3.

The first qubit device Q1 and the second qubit device Q2 may transmit quantum information via electromagnetic coupling through the first cavity C1, and the second qubit device Q2 and the third qubit device Q3 may transmit quantum information via electromagnetic coupling through the second cavity C2.

The second qubit device Q2 may selectively exchange information with the first qubit device Q1 and the third qubit device Q3. Three or more qubit chips are connected to each other with a coupled resonator, and thus, the scale of the quantum processing architecture may be expanded.

According to an embodiment, multiple qubit chips transmit quantum information using a resonator with a high quality factor, and thus, the loss of quantum information may be reduced.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A quantum processing device comprising:

a first qubit chip comprising a first qubit device;

a second qubit chip comprising a second qubit device; and a coupler configured to electromagnetically connect the first qubit chip with the second qubit chip by using electromagnetic resonance, wherein the coupler comprises a body that defines a first cavity, a first antenna and a second antenna separated from the first antenna within the first cavity, and wherein the first and second antennae are configured to be electromagnetically coupled to each other to enable the first and second qubits to exchange information through the coupling.

2. The quantum processing device of claim 1, wherein the first antenna and the second antenna include one or more of aluminum (Al), neobium (Nb), indium (In), tantalum (Ta), titanium (Ti), or nitrogen (N).

3. The quantum processing device of claim 1, wherein the first antenna and the second antenna are integrated with the body.

4. The quantum processing device of claim 1, wherein the first qubit chip further includes a first substrate including a first recess within which the first qubit device is disposed, and the body further includes a first through-hole connecting the first cavity and the first recess.

5. The quantum processing device of claim 4, wherein the first qubit chip further includes a first connection pin within the first through-hole and is configured to electrically connect the first qubit device with the first antenna.

6. The quantum processing device of claim 5, wherein the first connection pin directly contacts the first qubit device.

7. The quantum processing device of claim 5, wherein the first connection pin is spaced apart from the first antenna and is configured to be electromagnetically coupled to the first antenna.

8. The quantum processing device of claim 5, wherein the first connection pin is disposed to protrude from an opening of the first through-hole toward the first cavity.

9. The quantum processing device of claim 5, further comprising: an insulating material filling a space between the first connection pin and the first through-hole.

10. The quantum processing device of claim 4, wherein a partial region of the first qubit device is exposed to the first cavity through the first through-hole.

11. The quantum processing device of claim 1, wherein the first qubit device is configured to be electromagnetically coupled with the first antenna.

12. The quantum processing device of claim 1, wherein the first antenna and the second antenna are opposite each other within the coupler.

13. The quantum processing device of claim 1, wherein the first antenna and the second antenna are configured such that a longest length of each antenna is 1/4 or less of a wavelength of an electromagnetic wave coupling the first antenna and the second antenna.

14. The quantum processing device of claim 1, wherein a longest length of the first cavity is less than or equal to the to a wavelength of an electromagnetic wave coupling the first antenna to the second antenna.

15. The quantum processing device of claim 1, wherein the first qubit chip and the second qubit chip are disposed on a same surface of the first coupler.

16. The quantum processing device of claim 1, wherein the first qubit chip and the second qubit chip are disposed on different surfaces of the first coupler.

17. The quantum processing device of claim 1, further comprising: a third qubit chip including a third qubit device, wherein the body further includes a second cavity separated from the first cavity, the second cavity configured to electrically connect the second qubit chip with the third qubit chip by using electromagnetic resonance.

18. The quantum processing device of claim 17, wherein the second qubit chip further includes a second substrate including a second recess within which the second qubit device is disposed, and the body further includes a first sub through-hole connecting the first cavity to the second recess and a second sub through-hole connecting the second cavity to the second recess.

19. The quantum processing device of claim 18, wherein the second qubit chip further includes:

a first sub connection pin electrically connected with the second qubit device and penetrating the first sub through-hole; and a second sub connection pin electrically connected with the second qubit device and penetrating the second sub through-hole.

20. The quantum processing device of claim 1, wherein:

the first cavity includes a first sub cavity and a second sub cavity that are separated from each other;

the first antenna includes a first sub antenna disposed in the first sub cavity and electrically connected with the first qubit chip, and a second sub antenna disposed in the second sub cavity and electrically connected to the first qubit chip; and the second antenna includes a third sub antenna disposed in the first sub cavity and electrically connected with the second qubit chip, and a fourth sub antenna disposed in the second sub cavity and electrically connected with the second qubit chip.

* * * * *